United States Patent [19]

van Tuijl

[11] Patent Number: 4,591,804

[45] Date of Patent: May 27, 1986

[54] CASCODE CURRENT-SOURCE ARRANGEMENT HAVING DUAL CURRENT PATHS

[75] Inventor: Adrianus J. M. van Tuijl, Nijmegen, Netherlands

[73] Assignee: U.S. Philips Corporation, New York, N.Y.

[21] Appl. No.: 703,147

[22] Filed: Feb. 19, 1985

[30] Foreign Application Priority Data

Feb. 29, 1984 [NL] Netherlands ........................ 8400637

[51] Int. Cl.[4] ........................................ H03F 3/04

[52] U.S. Cl. .................................... 330/288; 323/316; 307/297; 330/311

[58] Field of Search ........................ 330/257, 288, 311; 307/297; 323/315, 316

[56] References Cited

PUBLICATIONS

Jaeger, "A High Output Resistance Current Source", *IEEE Journal of Solid State Circuits,* Aug. 1974, pp. 192–194.

*Primary Examiner*—James B. Mullins

*Attorney, Agent, or Firm*—Robert T. Mayer; Steven R. Biren

[57] ABSTRACT

A current source arrangement includes a first and a second transistor arranged in cascode between an output terminal and the negative power-supply terminal. The arrangement further includes a current mirror circuit, a current source connected to the positive power-supply terminal being connected to an input current path which comprises a third transistor connected as a diode, a fourth transistor connected as a diode, and the collector-emitter path of a fifth transistor, which input current path is coupled to a second current path comprising a sixth transistor whose base is connected to the base of the third transistor, a resistor, and a seventh transistor connected as a diode, whose base is connected to the base of the fifth and the second transistor. Further, the base of the first transistor is connected to the emitter of the sixth transistor. In this arrangement the collector-emitter voltage of the second transistor is equal to the collector-emitter voltage of the fifth transistor, which is equal to the voltage across the resistor. If the voltage across this resistor is substantially lower than one base-emitter voltage, a comparatively low voltage is obtained on the collector of the first transistor. Moreover, the ratio between the currents through the second and the fifth transistor is defined accurately by the ratio between the emitter areas of these transistors.

3 Claims, 1 Drawing Figure

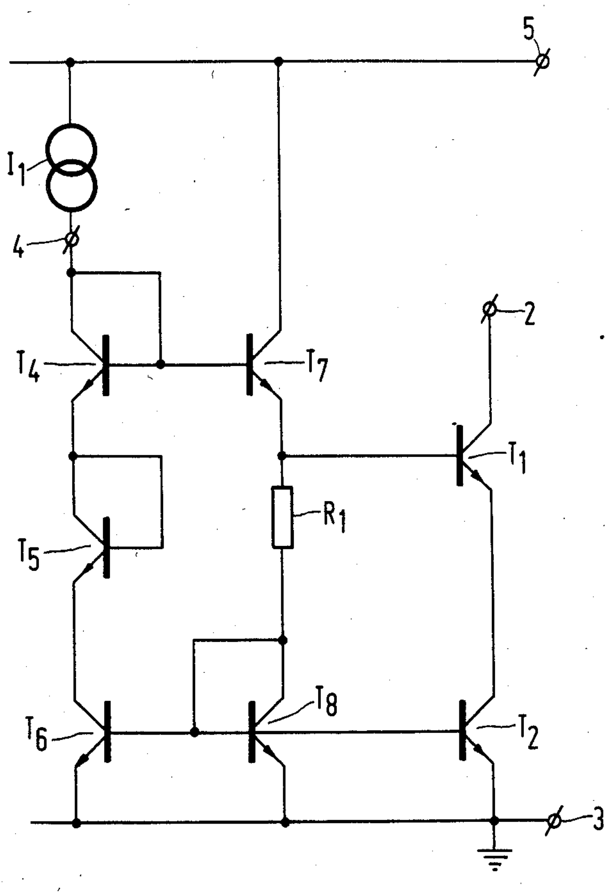
5
I1
4
2
T4
T7
T1
R1
T5
T8
T6
T2
3

CASCODE CURRENT-SOURCE ARRANGEMENT HAVING DUAL CURRENT PATHS

BACKGROUND OF THE INVENTION

The invention relates to a cascode current-source arrangement comprising a first and a second transistor whose collector-emitter paths are arranged in series between a first terminal and a common second terminal, and a third transistor connected as a diode, whose base is connected to the base of the second transistor and whose emitter is connected to the common second terminal.

Such cascode current-source arrangements are generally applicable in integrated circuits and are in particular suitable for use in amplifier circuits as described in U.S. patent application Ser. No. 703,146 filed simultaneously with the present application.

Such a current-source arrangement is known from FIG. 2 of U.S. Pat. No. 4,345,217. The collector current of the second transistor is defined by connecting a diode-connected transistor in parallel with the base-emitter junction of this second transistor. The collector current of the second transisttor then also flows through the collector-emitter path of the first transistor, whose base is at a reference voltage. As a result of this reference voltage the collector-emitter voltage of the second transistor is then also constant. In practice, this reference voltage is generally generated by arranging a second diode-connected transistor in series with the first diode-connected transistor, the base of said second diode-connected transistor being connected to the base of the first transistor. The collector-emitter voltage of the second transistor is then equal to one base-emitter voltage. A disadvantage of this arrangement is that, if the collector of the second transistor is used as a signal input, the lowest voltage attainable on the collector of the first transistor is equal to the sum of the base-emitter voltage, which appears across the collector-emitter path of the second transistor, and the saturation voltage of the first transistor. However, in order to obtain a maximum voltage swing the collector voltage of the second transistor must be as low as possible. This is of particular importance if the current-source arrangement is used with low supply voltages. Another disadvantage of this arrangement is that owing to the difference in the collector-emitter voltages of the diode-connected transistor and the second transistor, the current flowing through the second transistor is not exactly equal to the current through the diode.

SUMMARY OF THE INVENTION

An object of the present invention to provide a cascode current-source arrangement which does not have the aforementioned disadvantages. According to the invention a cascode current-source arrangement of a type as mentioned above is characterized in that it further comprises a first input current path which comprises, between a third terminal and the common second terminal, the series arrangement of a fourth transistor connected as a diode, a diode and the collector-emitter path of a fifth transistor, and a second current path which comprises, between a fourth terminal, connected to the base of the fourth transistor, and the common second terminal, the series arrangement of the base-emitter path of a sixth transistor, a resistor and the base-emitter path of the third transistor, whose base is further connected to the base of the fifth transistor, and the base of the first transistor is connected to that end of the resistor which is remote from the third transistor. In this arrangement in accordance with the invention the collector-emitter voltage of the second transistor is substantially equal to the voltage across the resistor in the second current path. The voltage across this resistor can be made substantially lower than one base-emitter voltage, so that the collector of the first transistor can be dirven to a very low voltage. Moreover, the voltage across this resistor is equal to the collector-emitter voltage of the fifth transistor, so that the collector-emitter voltage of the second transistor is equal to the collector-emitter voltage of the fifth transistor in the input current path, which transistors have also equal base-emitter voltages. Therefore, the ratio between the currents through the second and the fifth transistor is defined accurately by the ratio between the emitter areas of these transistors.

BRIEF DESCRIPTION OF THE DRAWING

The invention will now be described in more detail, by way of example, with reference to the accompanying single FIGURE of the drawing, which shows a cascode current-source arrangement in accordance with the invention.

DESCRIPTION OF THE PREFERRED EMBODIMENTS

The arrangement comprises a transistor $T_1$ and a transistor $T_2$ connected in cascode, the collector-emitter paths of these transistors being connected in series between an output terminal 2 and the negative power-supply terminal 3, in the present case ground. A load may be connected to terminal 2. The arrangement further comprises a current-mirror circuit which comprises an input current path which comprises, between an input terminal 4 and the power-supply terminal 3, the series arrangement of a diode-connected transistor $T_4$, a diode-connected transistor $T_5$, and the collector-emitter path of a transistor $T_6$. A current source $I_1=I$ is connected to input terminal 4 and to the positive power-supply terminal 5. The current-mirror circuit further comprises a second current path which comprises, between the positive power-supply terminal 5 and the negative power-supply terminal 3, the series arrangement of the collector-emitter path of a transistor $T_7$, whose base is connected to the base of the transistor $T_4$, a resistor $R_1=R$, and a diode-connected transistor $T_8$, whose base is connected to the base of transistor $T_6$ and to the base of transistor $T_2$.

If the emitter areas of the transistors $T_4$, $T_5$ and $T_6$ are, for example, twice as large as the emitter area of the transistor $T_7$ and transistor $T_8$, a current which is substantially equal to I/2 will flow in the second current path as a result of the commoned bases of the transistors $T_4$ and $T_7$ and the commoned bases of the transistors $T_6$ and $T_8$. Since transistors $T_4$ and $T_7$ have the same base voltage, the voltages between said commoned bases and the negative power-supply terminal 3 in the input current path and the second current path are equal. Therefore, the following equation is valid for this arrangement:

$$V_{BET4}+V_{BET5}+V_{CET6}=V_{BET7}+V_R+V_{BET8} \quad (1)$$

where the $V_{BE}$s are the base-emitter voltages of the relevant transistors, $V_{CET6}$ is the collector-emitter voltage of transistor $T_6$, and $V_R$ is the voltage across the resistor $R_1$. Owing to the ratios between the currents and between the emitter areas of the transistors $T_4$, $T_5$ and $T_6$ and the transistors $T_7$ and $T_8$, the base-emitter voltages of the transistors $T_4$, $T_5$, $T_7$ and $T_8$ are equal, so that it follows from equation (1) that $$V_{CET6}=V_R \quad (2)$$

If the emitter areas of the transistors $T_1$ and $T_2$ are, for example, twice as large as those of the transistors $T_4$, $T_5$ and $T_6$, the current flowing through transistors $T_1$ and $T_2$ will be twice as large as the current in the input current path. Moreover, the voltage between the base of transistor $T_4$ and the negative power-supply terminal 3 satisfies the following equation:

$$V_{CET6}+V_{BET5}+V_{BET4}=V_{BET7}+V_{BET1}+V_{CET2} \quad (3)$$

Owing to the ratios between the currents and between the emitter areas of the transistors $T_4$, $T_5$, $T_7$ and $T_1$ it follows from equation (2) that $$V_{CET6}=V_{CET2} \quad (4)$$

Since the collector-emitter voltages are equal, the ratio between the currents in the transistors $T_2$ and $T_6$ depends only on the ratio between the emitter areas, so that in the present example the current in transistor $T_2$ is exactly twice as large as the current in transistor $T_6$. Moreover, the voltage on the base of transistor $T_1$ is constant because a constant current of about I/2 flows through the series arrangement of the resistor $R_1$ and transistor $T_8$.

The value of the collector-emitter voltage of transistor $T_2$ depends on the resistance value of the resistor $R_1$ in conformity with equation (2) and (4). For a given value of the current this resistance value is selected in such a way that the voltage across this resistor is substantially lower than one base-emitter voltage. In a practical example of an arrangement with a supply voltage of 3 V, and in which $I_1=100\ \mu A$ and $R_1=4$ kohms, this voltage and hence the collector-emitter voltage of transistor $T_2$ for the given ratio between the emitter areas is equal to 200 mV. This voltage is such that transistor $T_2$ is not saturated. For the lowest supply voltage of 1.6 V at which the arrangement can operate the current $I_1=53\ \mu A$ when a current source $I_1$ is used whose current increases as a linear function of the supply voltage. The voltage across the resistor $R_1=4$ kohms and consequently the collector-emitter voltage of the transistor $T_2$ is then equal to 106 mV, which is high enough to ensure that transistor $T_2$ is not saturated. A major advantage of this low collector-emitter voltage of transistor $T_2$ is that the collector voltage of transistor $T_1$ is comparatively low. If a signal current is applied to the collector of transistor $T_2$, the collector of transistor $T_1$ can be driven to a lowest voltage equal to the collector-emitter voltage of the transistor $T_2$ plus one saturation voltage.

Another advantage of the arrangement is that a signal current may be applied to the collector of transistor $T_2$ without the collector-emitter voltage and consequently the collector current of the transistor $T_2$ varying significantly, because the collector-emitter voltage of transistor $T_2$ is equal to that of transistor $T_6$. The entire signal current appears on the collector of transistor $T_1$ without the collector-emitter voltage of transistor $T_2$ causing the collector current of the transistor $T_2$ to vary as a result of the Early effect.

The invention is not limited to the embodiment shown. For example, emitter-area ratios other than those given may be used. Further, one or more transistors may be arranged in parallel with the transistor $T_1$. Moreover, PNP transistors may be used instead of NPN transistors.

What is claimed is:

1. A cascode current-source arrangement comprising a first and a second transistor whose collector-emitter paths are arranged in series between a first terminal and a common second terminal, and a third transistor connected as a diode, whose base is connected to the base of the second transistor and whose emitter is connected to the common second terminal, characterized in that the arrangement further comprises a first input current path which comprises, between a third terminal and the common second terminal, the series arrangement of a fourth transistor connected as a diode, a diode and the collector-emitter path of a fifth transistor, and a second current path which comprises, between a fourth terminal, connected to the base of the fourth transistor, and the common second terminal the series arrangement of the base-emitter path of a sixth transistor, a resistor and the base-emitter path of the third transistor, whose base is further connected to the base of the fifth transistor, the base of the first transistor being connected to that end of the resistor which is remote from the third transistor.

2. A cascode current-source arrangement as claimed in claim 1, characterized in that the diode is a diode-connected transistor.

3. A cascode current-source arrangement as claimed in claim 1 or 2, characterized in that the resistance value of the resistor is selected so that the voltage across said resistor is smaller than the base-emitter voltage of any transistor of the current-source arrangement.

* * * * *